United States Patent
Watanabe

[11] 4,092,590
[45] May 30, 1978

[54] ELECTRONIC THREE-PHASE FOUR-WIRE SYSTEM WATT-HOUR METER

[75] Inventor: Kazumi Watanabe, Tokyo, Japan
[73] Assignee: Osaki Electric Co. Ltd., Tokyo, Japan
[21] Appl. No.: 582,423
[22] Filed: May 30, 1975
[51] Int. Cl.² ............... G01R 21/06; G01R 11/16
[52] U.S. Cl. ........................... 324/107; 324/111; 324/142
[58] Field of Search ............ 324/107, 142, 111, 108; 235/151.21

[56] References Cited

U.S. PATENT DOCUMENTS

| | | | |
|---|---|---|---|
| 2,302,474 | 11/1942 | Rich | 324/107 |
| 2,615,063 | 10/1952 | Brown | 324/111 |
| 2,998,569 | 8/1961 | Legatti et al. | 324/107 |
| 3,286,178 | 11/1966 | Ultcht | 324/107 |
| 3,794,917 | 2/1974 | Martin et al. | 324/142 |

Primary Examiner—Rudolph V. Rolinec
Assistant Examiner—Ernest F. Karlsen
Attorney, Agent, or Firm—Haseltine, Lake & Waters

[57] ABSTRACT

An electronic three-phase four-wire system watt-hour meter equipped with a single operational circuit which multiplies the voltage and the current of each phase of a three-phase alternating current power source of which electric energy is to be measured. Electronic switches are provided which work on voltage and electronic switches are provided which work on current in each phase. Said electronic switches are cyclically opened and closed by three-phase pulse signals provided for control. The operational circuit produces, in the form of a current, an output corresponding to the sum of the electric power of each phase of said three-phase alternating current source.

4 Claims, 7 Drawing Figures

ELECTRONIC THREE-PHASE FOUR-WIRE SYSTEM WATT-HOUR METER

BACKGROUND OF THE INVENTION a. Field of the Invention

The present invention relates to an electronic three-phase four-wire system watt-hour meter suited for the precision measurement of the electric energy of a three-phase four-wire system A.C. load.

b. Prior Art

Measurement of the electric energy of three-phase four-wire system A.C. loads, in general, requires three watt-hour meters or three electric energy measuring elements. Conventional three-phase four-wire system watt-hour meters consist of three operational circuits each of which multiplies the voltage and the current of one phase and converter circuits which convert the currents of the operational circuits into voltages. The outputs of the three current-voltage converter circuits are converted into a frequency signal by a voltage-frequency converter circuit, and the electric energy of a three-phase system is displayed by a pulse counter.

Conventional watt-hour meters of the above type require a lot of electronic parts and have deficiencies with regard to reliability and manufacturing cost. Furthermore, non-matching characteristics of the operational circuits and current-voltage converter circuits create interphase imbalance errors, thereby necessitating the provision of error adjusting means and rendering the assembling operations clumsy and troublesome. Besides, they impose limitations on measuring accuracy.

SUMMARY OF THE INVENTION

It is an object of the present invention to provide an electronic three-phase four-wire system watt-hour meter suited for the precision measurement of electric energy and having a smaller number of electronic parts then heretofore required and furthermore having a simple construction.

It is another object of the present invention to provide an electronic three-phase four-wire system watt-hour meter which can directly and easily convert output into pulses by converting the output of an operational circuit into a current output.

The electronic three-phase four-wire system watt-hour meter of the present invention comprises three voltage transformers and three current transformers, said transformers being adapted to recover, at reduced values, the voltage and current of each phase of a three-phase four-wire system A.C. load which is to be measured. Electronic swithes which work on voltage and current are cyclically opened and closed by three-phase pulse signals adapted for performing controlling functions, said electronic switches being connected, respectively, to the secondary side of the voltage transformers and to the secondary side of the current transformers.

An operational circuit is provided which multiplies the voltage and current of each phase fed sequentially through each of the electronic switches and which produces, in the form of current, an output corresponding to the sum of the power of each phase. A current-pulse converter circuit which converts the current output of the operational circuit into pulses is used and a pulse counter which counts the pulses from the current-pulse converter circuit and displays the electric energy of the three-phase system is also employed.

According to the present invention, in which the voltage and current of each phase are multiplied by a single operational circuit by the switching operation of the electronic switches, a smaller number of electronic parts are required, construction is simplified and manufacturing cost is reduced. In addition, the interphase balance is not interfered with as the operational circuit works in common to each phase and this helps to increase measuring precision. Besides, the output, which takes the form of an electric current, can be directly and easily converted into pulses by integration, enabling the provision of a high-precision watt-hour meter.

DETAILED DESCRIPTION

Figure 1:
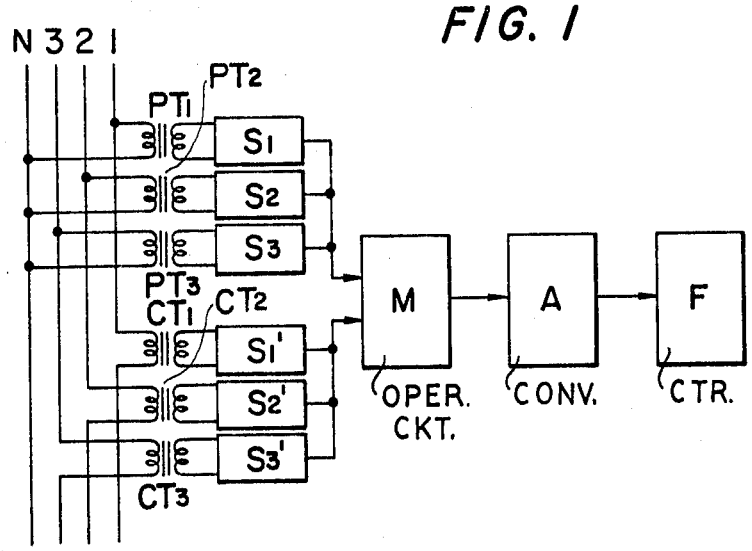
FIG. 1 is a block diagram of a meter circuit in accordance with the present invention.

In FIG. 1, voltage transformers $PT_1$, $PT_2$, $PT_3$ and current transformers $CT_1$, $CT_2$, $CT_3$ are connected to wires 1, 2 and 3 and to a neutral wire N of a three-phase system, to step down the voltages and currents of the three-phase wires 1, 2 and 3 and neutral wire N to voltages and currents adapted to the electronic parts which are employed. For example, a potential of 110 volts may be stepped down to few volts and a current of 5 amperes may be stepped down to several tens of milliamperes or several milliamperes.

Electronic switches $S_1$, $S_2$ and $S_3$ for voltages are connected to the secondary side of the voltage transformers $PT_1$, $PT_2$ and $PT_3$ and electronic switches $S_1'$, $S_2'$ $S_3'$ for currents are connected to the secondary side of the current transformers $CT_1$, $CT_2$ and $CT_3$, respectively. The electronic switches $S_1$-$S_3$ and $S_1'$-$S_3'$ may, for example, be constituted by transistors and are cyclically opened and closed by three-phase pulse signals for effecting controlling functions. The electronic switches $S_1'$, $S_2'$ $S_3'$ are circuit changing switches and, in opened state, each of them shorts the output of the corresponding current transformer $CT_1$, $CT_2$ and $CT_3$ and, in closed state, each connects the secondary side of the current transformer $CT_1$, $CT_2$ or $CT_3$ to the following circuit.

The operational circuit M multiplies the voltage and current of each phase introduced via electronic switches $S_1$-$S_3$ and $S_1'$-$S_3'$ and produces, in the form of current, an output corresponding to the sum of the electric powers of each of the phases. The output of the operational circuit M is converted by a current pulse converter circuit A into pulses of a number corresponding to the intensity of the current. Pulses are counted by a pulse counter F and the count is displayed to represent the electric energy of the three-phase system.

Figure 2:
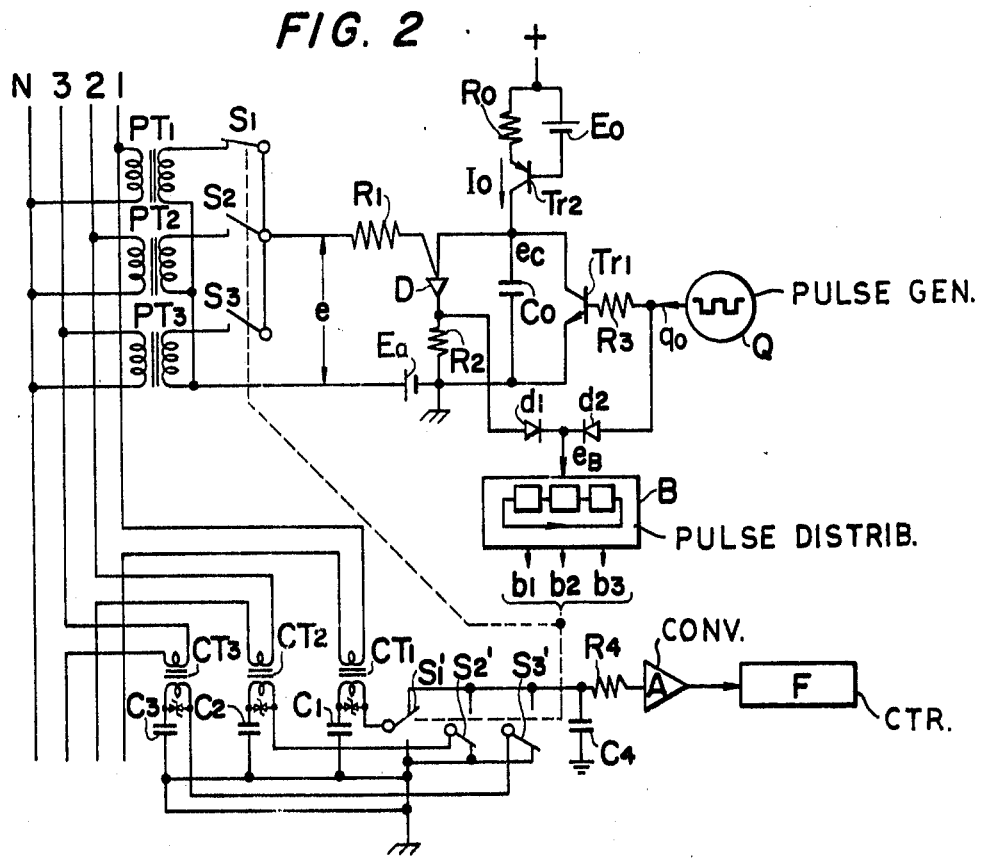
FIG. 2 is a schematic circuit diagram showing a first embodiment of the present invention.

FIG. 2 shows a first embodiment, according to the present invention, in which the same parts as those of FIG. 1 are represented by the same symbols. Symbols $R_0$ to $R_4$ represent resistors. Component D is a trigger diode. Components $E_O$ and $E_a$ are reference power supplies. Components $C_0$ to $C_4$ are capacitors.

The circuit also includes transistors $Tr_1$ and $Tr_2$, a pulse generator Q, diodes $d_1$ and $d_2$, and a three-phase pulse distributor B for control consisting, for example, of a shift register.

Voltage $e$ is the secondary voltage of the voltage transformers $PT_1$–$PT_3$, voltage $e_c$ is the charging voltage for capacitior $C_O$, current $I_O$ is a reference current, signal $q_O$ is a pulse signal, and signals $b_1$, $b_2$ and $b_3$ are pulse signals to control the electronic switches $S_1$–$S_3$ for voltage and electronic switches $S_1'$–$S_3'$ for current.

Figure 3:
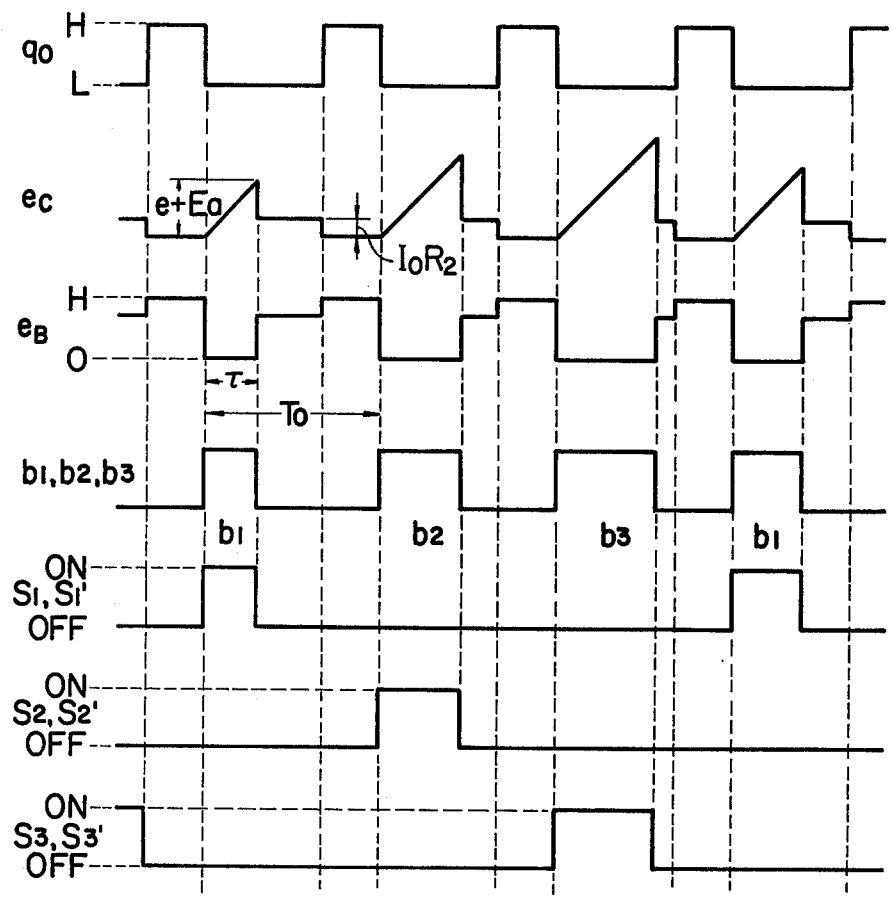
FIG. 3 is a time chart to illustrate the operation of the first embodiment of the present invention.

Operation of the first embodiment is described below with reference to FIG. 3. The frequency of the pulse signal $q_O$ from the pulse generator Q is very much higher than the three-phase A.C. frequency which is to be measured. The width of the pulses, for example, is one-third of the period.

When the pulse signal $q_O$ is of a high level H, the transistor $Tr_1$ is rendered conductive, thereby short-circuiting the capacitior $C_O$. The input which enters the three-phase pulse distributor B via diode $d_1$ will be zero.

On the other hand, a positive pulse will be fed from the puse generator Q via diode $d_2$, so that the input $e_B$ of the three-phase pulse distributor B assumes a high level H. None of the pulse signals $b_1$, $b_2$ and $b_3$ is then produced, and the electronic switches $S_1$, $S_1'$, $S_2$, $S_2'$, $S_3$ and $S_3'$ are all opened. The opened state of the electronic switches $S_1'$, $S_2'$, $S_3'$ means the state that the switch arms are joined to the lower contacts to short the outputs of the current transformers $CT_1$, $CT_2$, $CT_3$.

During the period when pulse signal $q_O$ takes a low level L, the transistor $Tr_1$ is interrupted, and the capacitor $C_O$ is charged by reference current $I_O$ which flows through the transistor $Tr_2$. The charging voltage $e_C$ of the capacitor $C_O$ rises linearly, but the trigger diode D is not made conductive until the voltage applied to the gate trigger diode D reaches value $(e + E_a)$. Hence, the input which enters the three-phase pulse distributor B via diode $d_1$ is zero. Since the input which enters via diode $d_2$ is zero, too, the input $e_B$ of the three-phase pulse distributor B will be zero. Then the pulse signal $b_1$ rises and renders the electronic switches $S_1$, $S_1'$ closed. The closed state of the electronic switch $S_1'$ means that the switch arm is joined to the upper contact to connect the secondary side of the current transformer $CT_1$ to the followinng circuit.

As the charging voltage $e_C$ of the capacitor $C_O$ exceeds the value $(e + E_a)$, the trigger diode D is rendered conductive. A voltage $I_O R_2$ is produced across the ends of the load resistor $R_2$, and enters the three-phase pulse distributor B via diode $d_1$. Therefore, the zero-level width $\tau$ of the input $e_B$ of the three-phase pulse distributor B is equal to the charging time of the capacitior $C_O$ and is represented by the relation $$\tau = C_O(E_a + e)/I_O = C_O E_a/I_O + C_O e/I_O = \tau_0 + \Delta\tau$$

Here, $$\tau_0 = C_O E_a/I_O, \quad \Delta\tau = C_O e/I_O = K \cdot C_O/I_0 \cdot e_{max} \cdot \cos wt$$

The three-phase pulse distributor B continues to produce control pulse signal $b_1$ while the input $e_B$ remains at a zero level. The pulse width of a control pulse signal $b_1$ is equal to the width $\tau$ of zero level. This means that said pulse width is modulated by the secondary voltage $e$ of the voltage transformer $PT_1$. The closure time of the electronic switches $S_1$ and $S_1'$, which will be closed by the control pulse signal $b_1$, is equal to the zero-level width and corresponds to the secondary voltage $e$ of the voltage transformer $PT_1$. Therefore, the amount of current flowing through the electronic switch $S_1'$ corresponds to the product of voltage and current of a first phase of the three-phase system which is to be measured.

During the next cycle of the pulse signal $q_O$, the electronic switches $S_2$ and $S_2'$ operate and, during the third cycle, the electronic switches $S_3$ and $S_3'$ operate. During the fourth cycle, the electronic switches $S_1$ and $S_1'$ operate again. That is, the electronic switches $S_1$ and $S_1'$, $S_2$ and $S_2'$, and $S_3$ and $S_3'$ are opened and closed every three cycles, i.e., for every $3T_O$ period cyclically.

Figure 4:
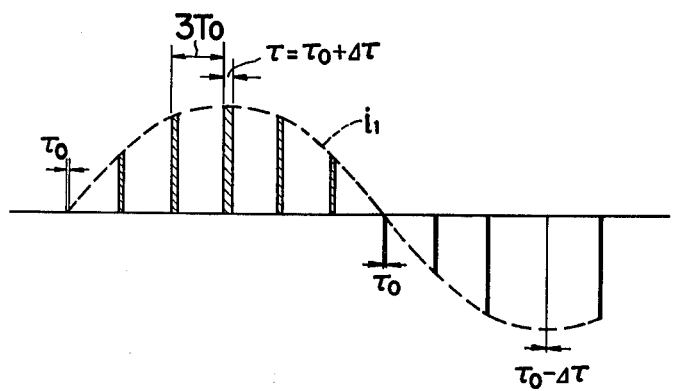
FIG. 4 is a diagram showing wave forms of current flowing through an electronic switch for current used in the first embodiment of the present invention.

FIG. 4 shows a current (hatched portions) due to the closure of the electronic switch $S_1'$. The symbol $i_1$ stands for a secondary current of the current transformer $CT_1$. The currents due to the closure of the electronic switches $S_2'$ and $S_3'$ assume the same pattern. These three currents constitute the output of the operational circuit.

The output current is smoothed by the capacitor $C_4$ and turned into an averaged D.C. current. The D.C. current is proportional to the sum of the electric powers of each phase and converted into pulses of a number proportional to the current through the current-pulse converter circuit A composed of an integration circuit, counted by a pulse counter F, and displayed to represent three-phase electric energy.

According to this embodiment, since the electronic switches $S_1'$, $S_2'$ and $S_3'$ are current switches, the internal resistances thereof have very small effect on the produced output. Also, since the produced output is a current, the current-pulse converter circuit A develops only a very small voltage drift.

Figure 5:
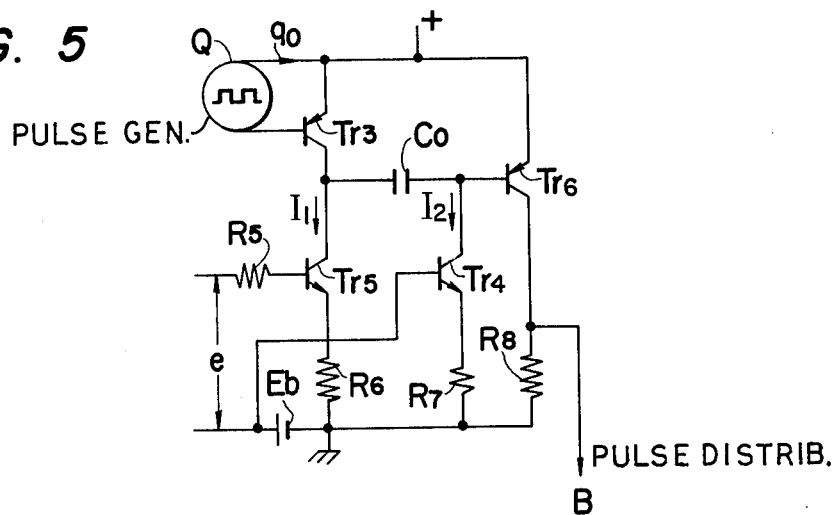
FIG. 5 shows a modified circuit diagram of a pulse-width modulating circuit used in the first embodiment of the present invention.

Although the pulse-width modulator circuit of the first embodiment consists of a trigger diode D, the pulse-width modulator circuit may be composed of transistors. An example is shown in FIG. 5. Referring to FIG. 5, the same parts as those of FIG. 2 are represented by the same symbols. Components $Tr_3$ to $Tr_6$ are transistors, components $R_5$ to $R_8$ are resistors, $E_b$ is a reference power supply, $I_1$ is charging current, and $I_2$ is a constant current.

During the period in which the pulse signal $q_O$ of the pulse generator Q assumes a low level, the transistor $Tr_3$ is interrupted, and the charging current $I_1$ flows in the circuit: positive power supply — emitter-base of transistor $Tr_6$ — capacitor $C_O$ — collector-emitter of transistor $Tr_5$ — resistor $R_6$ — ground. Thereby, the capacitor $C_O$ is charged. The charging current $I_1$ is proportional to the sum of secondary voltage $e$ of voltage transformer $PT_1$, $PT_2$ or $PT_3$ and the voltage $E_b$ of the reference power supply $E_b$. During the period in which the pulse signal $q_O$ assumes a high level, the transistor $Tr_3$ is rendered conductive, so that the transistor $Tr_6$ is interrupted. Therefore, a constant current $I_2$ flows in the circuit: positive power supply — emitter-collector of transistor $Tr_3$ — capacitor $C_O$ — collector-emitter of transistor $Tr_4$ — resistor $R_7$ — ground. Thereby, the capacitor $C_0$ is reversely charged (i.e., discharged). The constant current $I_2$ is proportional to the voltage $E_b$ of the reference power supply $E_b$. Hence, the base potential of the transistor $Tr_6$ drops down at a speed proportional to the constant current $I_2$ and, then the transistor $Tr_6$ is rendered to be conductive again. At this moment, the transistor $Tr_6$ is interrupted for a period of the discharge time $\tau$ of the capacitor $C_O$, and the collector potential of the transistor $Tr_6$ is zero. The collector potential is an input to the control three-phase pulse distributor B. The charging amount $I_1T$ (T is a pulse width of the pulse signal $q_O$) fed to the capacitor $C_O$ is equal to the discharging amount $I_2 \tau$ discharged from the capacitor $C_O$. There is the following relation:

$$\tau = I_1 T/I_2 \alpha e + Eb$$

The discharge time $\tau$ is modulated by the secondary voltage $e$ of the voltage transformers $PT_1$, $PT_2$ and $PT_3$.

Figure 7:
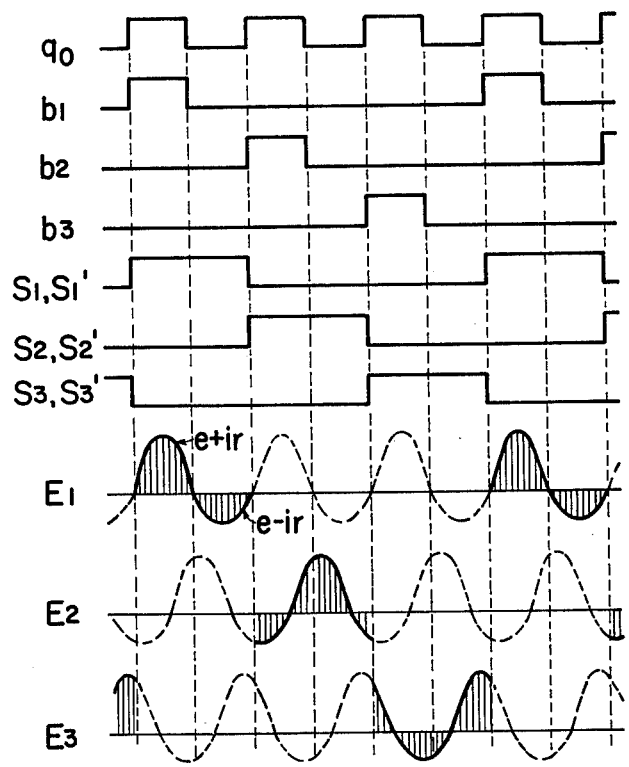
FIG. 7 shows a time chart for illustrating the operation of the second embodiment of the present invention.
Figure 6:
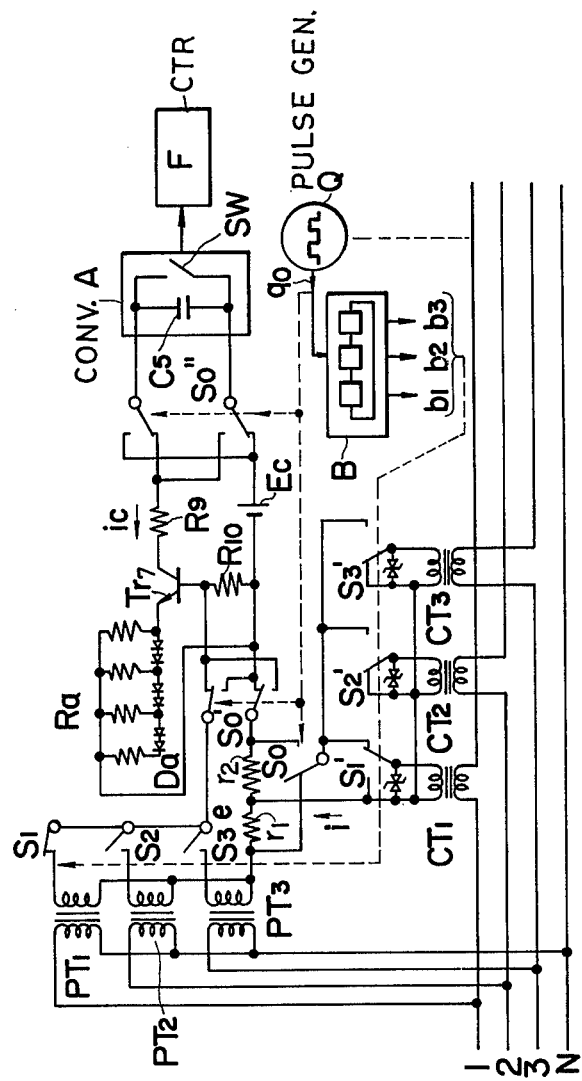
FIG. 6 is a circuit diagram of a second embodiment of the present invention.

FIG. 6 shows a second embodiment of the present invention. In this embodiment, too, the electronic switches $S_1$ to $S_3$ (for voltage) and electronic switches $S_1'$ to $S_3'$ (for current) are opened and closed by the same control pulse signals $b_1$ to $b_3$. Parts which are the same as those of FIGS. 1 and 2 are represented by the same symbols. Components $r_1$ and $r_2$ are load resistors having the same resistance $r$, components $R_9$ and $R_{10}$ are resistors, and component $R_a$ is a resistor array. Component $D_a$ is a diode array, component $Tr_7$ is a transistor, $E_c$ is a power supply for transistor $Tr_7$, and component $C_5$ is a capacitor, component SW is a switch which closes when the charging voltage of the capacitor $C_5$ has exceeded a determined value, components $S_O$, $S_O'$ and $S_O''$ are interlocked electronic switches that are opened and closed in synchronism with the pulse signal $q_O$, and $i$ is a secondary current of the current transformers $CT_1$ and to $CT_3$. The pulse generator Q produces a pulse signal $q_O$ that is in synchronism with the three-phase A.C. system that is to be measured. $i$ Operation of the second embodiment is described below with reference to FIG. 7. During the half cycle in which a positive pulse of the pulse signal $q_O$ is present, the interlocked electronic switches $S_O$, $S_O'$ and $S_O''$ are controlled to assume the state shown in FIG. 6. The control three-phase pulse distributor B produces a control pulse signal $b_1$ to close the electronic switches $S_1$ and $S_1'$. The secondary current $i$ of the current transformer $CT_1$ flows through the load resistor $r_1$. The voltage $E_1$ viewed from the right side of the interlocked electronic switch $S_O'$ will be $(e + ir)$. This voltage $(e + ir)$ is supplied to the base of the transistor $Tr_7$.

This transistor $Tr_7$, resistor array $R_a$ and diode array $D_a$ constitute a squaring circuit, in which the transistor $Tr_7$ is used as an emitter follower connected to the resistor array $R_a$ and diode array $D_a$. When an input voltage to the base is small, the current flows only into the resistor and diode nearest to the emitter of the transistor $Tr_7$ due to the voltage drops of diodes of the diode array $D_a$. As the input voltage to the base increases, the current flows gradually towards the diodes and resistors of the left side, and the total current increases in an accelerating manner. The collector current $i_c$ varies in proportion to the input voltage to the base $(e + ir)^2$ as individual resistances of the resistor array $R_a$ have been so set as to effect a squaring function. The collector current $i_c$ charges the capacitor $C_5$ to the current-pulse converter circuit A.

During the half cycle in which the pulse signal $q_O$ assumes a zero level, the interlocked electronic switches $S_O$, $S_O'$ and $S_O''$ are changed to the state opposite to that of FIG. 6. The secondary current $i$ of the current transformer $CT_1$ flows through the load resistor $r_2$, and the voltage $E_1$ takes on a value $(e - ir)$. The voltage $(e - ir)$. The voltage $(e - ir)$ which is of a negative polarity is turned into an opposite polarity by the interlocked electronic switch $S_O'$ and supplied to the base of the transistor $Tr_7$. The transistor $Tr_7$ is energized and the collector current $i_c$ varies in proportion to $(e - ir)^2$. The collector current $_c$ is turned to opposite polarity by the interlocked electronic switch $S_O''$ and flows into the capacitor $C_5$ of the current-pulse converter circuit A. Therefore, the average current of one cycle of the collector current $i_c$ flowing in the capacitor $C_5$ is proportional to $(e + ir)^2 - (e - ir)^2 = 4eri$, i.e., proportional to the product of voltage and current of the first phase, or proportional to the electric power of the first phase.

During the next cycle of the pulse signal $q_O$, the electronic switches $S_2$ and $S_2'$ are closed. Voltage $E_2$ is produced, and the collector current $i_c$ flows in proportion to the electric power of the second phase. Further, during the next cycle, the electronic switches $S_3$ and $S_3'$ are closed. Voltage $E_3$ is produced, and the collector current $i_c$ flows in proportion to the electric power of the third phase. Accordingly, the sum of collector currents $i_c$ of the three cycles is proportional to the electric power of the three phases and becomes an output of the operational circuit. The collector currents $i_c$ of the first to third phases charge the capacitor $C_5$. As the charging voltage reaches a determined value, the switch SW is closed to permit discharge. This discharge forms a pulse which is fed to the pulse counter F and counted and indicated. Therefore, the number of pulses is proportional to the integration of collector currents $i_c$, i.e., to the electric energy of three phases.

In this embodiment, errors due to internal resistances of the electronic switches $S_1-S_3$, $S_1'-S_3'$, $S_O$, $S_O'$ and $S_O''$ can sometimes create a problem. However, since the electronic switches (except $S_1-S_3$) are those employed in the current circuits and, especially, since the operated output is obtained as a collector current of the transistor $Tr_7$, internal resistances of the electronic switches are not really much of a problem. The current which directly flows into the capacitor $C_5$ can simply be integrated and converted into pulses.

What is claimed is:

1. An electronic three-phase four-wire system watthour meter comprising:

three voltage transformers and three current transformers which respond, at reduced values, to voltages and currents of each phase of a three-phase four-wire system A.C. load which is to be measured, said transformers including primary and secondary windings;

electronic switches for voltage and current which are connected to the secondary windings for each of the voltage transformers and current transformers and are adapted for being cyclically opened and closed by three-phase control pulse signals;

means to generate the said three-phase control pulse signals in rectangular wave form;

a single operational circuit which is coupled in common to said switches and which multiplies the voltage and current of each phase as received from said electronic switches and produces an output corresponding to the sum of the electric power of the phases in the form of current;

a current-pulse converter circuit which converts the current output of said operational circuit to pulses; and a pulse counter which counts the pulses from the current-pulse converter and displays the electric energy of the three-phase A.C. system, said operational circuit comprising pulse distributor means, trigger means, first and second reference power sources, a capacitor, first and second transistors, a pulse generator and first and second diodes, said pulse generator generating a pulse signal havng high and low levels and a frequency substantially greater than that of the three-phase system to be measured, said first transistor being coupled to said pulse generator and across said capacitor and shorting the latter when the pulse signal is at the high level, said first diode being coupled between said trigger means and said pulse distributor means, said second diode being coupled between said pulse generator and said pulse distributor means and passing positive pulses to the latter, said pulse distributor means upon receipt of a positive pulse from said second diode terminating generation of pulses and opening said electronic switches thereby shorting the secondaries of the current transformers, said first transistor responsing to the low level of the pulse signal to permit said capacitior to be charged via said second transistor from said first power source, said trigger means being fired when the voltage of said capacitor reaches a value related to that of said second power source and the secondary of the voltage transformer whereupon said distributor means commences a sequential operation of said switches.

2. An electronic three-phase four-wire system watt-hour meter as claimed in claim 1, comprising an RC circuit coupling the switches, which are coupled to said current transformers, to said converter circuit.

3. An electronic three-phase four-wire system watt-hour meter as claimed in claim 1, wherein said trigger means includes a trigger diode.

4. An electronic three-phase four-wire system watt-hour meter as claimed in claim 1, wherein said trigger means includes a transistor circuit.

* * * * *